United States Patent [19]

MacDonald, Jr. et al.

[11] 4,131,472
[45] Dec. 26, 1978

[54] METHOD FOR INCREASING THE YIELD OF BATCH PROCESSED MICROCIRCUIT SEMICONDUCTOR DEVICES

[75] Inventors: James L. MacDonald, Jr., Sherman Oaks; Richard A. Mink, Northridge, both of Calif.

[73] Assignee: Align-Rite Corporation, Burbank, Calif.

[21] Appl. No.: 723,333

[22] Filed: Sep. 15, 1976

[51] Int. Cl.² ............................ G03C 5/00; G03C 5/04
[52] U.S. Cl. .............................. 96/38.3; 96/27 R; 96/36; 96/36.2; 96/38.4; 96/44; 29/574; 29/575; 29/407; 156/626; 156/901; 427/8; 356/389
[58] Field of Search ............... 96/36.2, 27 R, 38.2, 96/38.3, 38.4, 44, 36; 29/574, 575, 407; 156/626, 901; 427/8, 10, 164; 356/114, 172, 162

[56] References Cited

U.S. PATENT DOCUMENTS

| | | | |
|---|---|---|---|
| 3,477,848 | 11/1969 | Pritchard | 96/27 R |
| 3,506,442 | 4/1970 | Kerwin | 96/38.3 UX |
| 3,545,854 | 12/1970 | Olsson | 356/162 X |
| 3,591,284 | 7/1971 | Liebman | 96/36.2 UX |
| 3,607,267 | 9/1971 | Garrels | 96/27 R |
| 3,615,463 | 10/1971 | Kuschell | 96/44 |
| 3,615,466 | 10/1971 | Sahni | 96/36.2 |
| 3,618,201 | 11/1971 | Makimoto et al. | 29/574 |
| 3,647,445 | 3/1972 | Burns | 96/38.4 |
| 3,647,457 | 3/1972 | Kerwin | 96/36.2 |
| 3,674,488 | 7/1972 | Dodd et al. | 96/36.2 X |
| 3,742,229 | 6/1973 | Smith et al. | 96/36.2 UX |
| 3,808,527 | 4/1974 | Thomas | 29/574 |
| 3,855,023 | 12/1974 | Spicer et al. | 96/36.2 X |
| 4,037,969 | 7/1977 | Feldman et al. | 356/172 |

OTHER PUBLICATIONS

Kaplan, "A Microprocessor-Controlled Mask Inspection and Repair System", Solid State Technology, Apr. 1976, pp. 74–78.

Primary Examiner—Edward C. Kimlin
Attorney, Agent, or Firm—Lyon & Lyon

[57] ABSTRACT

An improvement in the process of manufacturing integrated circuits to enhance the yield, including the steps of tracking which of the individual dies on a photomask or related series of photomasks has produced a predominance of defective chips on the semiconductor wafer, then correcting the die images on the master photomasks and then producing new working masks. This procedure may be repeated several times, each time reducing the number of defect-bearing die images on the photomask and thereby providing a means by which a semiconductor device manufacturer can obtain better yields.

5 Claims, No Drawings

METHOD FOR INCREASING THE YIELD OF BATCH PROCESSED MICROCIRCUIT SEMICONDUCTOR DEVICES

BACKGROUND OF THE INVENTION

Most types of integrated circuits are manufactured by what is essentially a photographic process. A wafer of semiconductor material of a selected type is coated with a photoresistive material and then a mask is placed over the wafer and subjected to a light source. In the production of integrated circuits, this process may be repeated a number of times using several different photomasks in a desired sequence in order to produce the finished semiconductor chip. Thus, the chip consists of a plurality of layers and patterns produced in this fashion from separate photomasks laid one at a time in precise alignment with one another.

A photomask used for this purpose is a coated glass plate with small multiple photographic images printed thereon which have been built to extremely tight tolerances. Each step in the production of high quality precision photomasks must be carefully controlled for temperature, humidity and extreme cleanliness to insure that dimensional tolerances are met and that defects are kept to a minimum. As will be more precisely described subsequently, the photomasks actually used for the production of a semiconductor chip are the exact size of the finished chip and thus comprise a network of various small lines which are optically opaque separated by small lines and areas which are optically transparent. Obviously, any undesired solid or non-light transmitting particles which might find their way onto these photomasks, either during the use of the photomasks for the production of a chip or during the manufacture of the mask itself, would produce a defective product.

Many other problems can arise, however, during the manufacture of chips. Ordinarily, a photomask comprises an array of die images, each die image representing a separate mask for a separate chip, and the finished chip, as previously stated, may be made up of several layers, each layer being made up from a separate photomask; the die images of which have separate patterns. For example, a typical photomask may comprise several hundred separate die images. When this photomask is applied to a semiconductor wafer, it would be possible to produce from that wafer an equal number of integrated circuits if all of the die images on the photomask were free of defects and if other problems did not create defects during the production process. On the contrary, however, the usual yield for a given wafer may be about ten to thirty percent. After the photographic processes are finished with the wafer, the manufacturer tests each circuit for defects and rejects the defective chips. Due to the complex nature of the devices and the inability to accurately analyze a given chip for the source of the defect which has occurred therein, it is extremely difficult to determine why a particular chip is defective, or at least, it is difficult and expensive to determine the source of the defects. Thus, it is more economical to throw away the rejects, and such is the industry practice. Obviously, one of the most logical sources of a defective chip is a defect in a mask or set of masks.

A great deal of semiconductor material is being wasted under current manufacturing techniques by the low yields being obtained. The general approach by the industry as of the present date towards increasing yield has been a statistical approach. It has not been economically feasible to make a one hundred percent inspection of each finished photomask to ascertain and eliminate all the defects in all of the die images. As aforesaid, a typical mask may comprise several hundred or more die images and to check each die image on the mask may take as long as eight hours or more. Semiconductor manufacturers have not generally been willing to pay for such inspection procedures because they result in a substantial increase in photomask costs. This is, however, one available alternative for the purposes of yield improvement albeit a costly one.

It is currently a typical industry procedure to thoroughly inspect about ten percent of the masks produced for a typical batch, then inspecting ten percent of the area thereof and to allow the mask to pass inspection if it has no more than ten to twenty percent defective die images of those inspected. One way to obtain better yields is for chip manufacturers to increase the inspection techniques and tighten up the standards for rejection. Of course, manufacturers could require one hundred percent inspection of every die image in an array so that the photomask maker must map all defects and then repair as many of the defects as possible in order to make a perfect master plate. Even then, unless the manufacturer is going to use the master plate rather than working plates, there is still a possibility for additional defects. In addition, the laser trimmer technique of repairing defects is only operative where the defect is an opacity such as may be caused by a particle of dust or a void in the photoresistive coating. If the defect is transparent where it should be opaque, there are no presently known commercially usable techniques for repairing such a die image.

Another means of increasing yield would be to use the master plate rather than subplates or working plates made from these subplates. Subplates or submaster plates are made by a contact print from the master and thus the image is reversed. Working plates are contact printed from the subplates or submaster plates. Every reprint from a master plate gives increasing errors either in the image or the fit since size changes are inevitable during the reprinting process. Further, it is obvious that during every reprint there are opportunities for dust particles or voids in the photoresistive coating of the blank plate being printed upon to create further defects.

Another method which might be employed to improve yield is to adjust the design rules for the layout of the integrated circuit such as by changing the geometry of the die image or the pattern within the die image to make more open spaces. While this tends to reduce defects in the die images, it also tends to make them larger, which is contrary to current market demands for smaller size chips. Another technique for reducing defects is to use a proximity or a projection printing process. The currently popular practice is to place the photomask in close physical contact with the silicon wafer and in doing so it is possible to trap opacities between them. Proximity or projection printers do not require that the mask be in contact with the wafer.

There is another technique for very high yield production consisting of a rather expensive and complex device known as an electron beam pattern composition generator which "writes" the circuit pattern on the wafer under computer control. Here, there is nothing at all in contact with the wafer. Such a pattern generator is currently in the research and development stage and presently has a very low production rate.

It will be noted that the commonly used techniques for decreasing defects are primarily techniques that one is to employ as one progresses through the process. Tightening up photomask quality inspection standards and rejection levels and other similar approaches are primarily a statistical attack on the problem. Nothing is known or currently practiced to relate a defective chip with its cause nor is there any known way to relate mask related defects in an exact manner with individual die image failure or sectional wafer failure.

SUMMARY OF THE INVENTION

The present invention constitutes an improvement in the overall process for the production of integrated circuits in providing a technique for relating defective chips to a particular die image or set of die images on a set of photomasks. A defective chip is related by indexing methods to its parent die image or set of die images and then the corresponding photomask or set of photomasks are inspected to ascertain the location of the defect. By then going back to the master mask and repairing the defect through laser trimming or other repair methods, one obtains a new working mask with the defect eliminated for further production purposes. As one of the steps of the process during which the photomask is made, the invention includes the addition to each mask of a unique set of index numbers. These will then be printed on the working mask and used by the chip manufacturer. An additional benefit from these index numbers is consistency of alignment of one mask over another. A further advantage of the present process is that by providing die images with individual index numbers or symbols, one cannot only identify which die images are producing a predominance of defective chips, but one can also identify die images that produce circuits having the most ideal circuit characteristics, and ones having secondary grade characteristics, as may be desired for grading purposes.

DESCRIPTION OF THE INVENTION

The process by which most integrated circuit semiconductor devices are manufactured begins, of course, with development of a specific logic diagram. After the design has been logically and physically verified, the designer proceeds to design cells to perform the logic functions and prepares schematic diagrams. Actual physical layout of the chip is then done by positioning the logic cells, many of which may be reused several times within a given chip, and other circuit elements within a specific geometry. Several layouts may be necessary to optimize interconnection density, keep path lengths reasonable, diminish undesirable thermal gradients and to minimize chip size.

After the layout is finalized, a composite is generated either manually or with computer assistance. A composite is a drawing having all the layers of a chip on one sheet of drawing. The logic circuits are placed in geometric form, positioning the transistors, capacitors, circuit paths, etc. The composite is then separated into individual layers called rubyliths, which are the camera-ready artwork. This may be done manually by hand cutting from the drawings. The computer method may include utilization of standard cells to automatically compose a composite or after manual preparation of the composite, the data on the composite may be digitalized to generate an artwork tape. The artwork tape may then be used to drive a pattern generator which produces the rubyliths at 200X or 400X or a single die glass master reticle at 10X size, thus obviating the need for 200X or 400X rubyliths and their subsequent photoreduction. If rubyliths are made, the next step is to photographically reduce them to 10X size and produce a single die glass master reticle image.

From this point of the process on, care must be taken to avoid defects. Temperature and humidity must be controlled to insure accuracy and repeatability, and cleanliness must be observed to reduce the production of unintended opacities on clear regions. A second photoreduction process reduces the 10X reticle image to 1X size exposing the image on a photosensitive coated glass plate and a step and repeat camera fixture simultaneously moves and re-exposes the image until the usable area of the glass plate is covered with multiple images that are the same. Again, temperature and humidity control are extremely important and cleanliness is paramount since at the present size of the image, dust particles of any size are large enough to cause defects on the plate. The step and repeat plate will be used as a master to produce the finished photomask and any defects on the master will appear on the final part plus any defects added in the materials here or in the subsequent process steps. The matching or overlay of all layers in a set of photomasks is critical to good production yield and the accuracy of the step and repeat camera is a demanding function in that regard.

At the time the full size (typically 20X through 1000X) composite drawing is prepared, an unused area within the die pattern is selected for the location of identification indicia. After the step and repeat operation, the camera is returned to the start position on the glass plate and the 10X glass reticle is removed and an automatic indexing fixture is inserted in place of it. The automatic indexing fixture produces images having different numbers, they may be sequential or they may not be sequential as desired, or any types of symbols or alpha/numerical indicia may be employed. Using the automatic indexing fixture, each photographic die image is then individually numbered and identified at the previously selected position. The photomask master plate is then processed in the normal manner.

After the master has been fabricated, a contact print is made, normally on a hard surface photographic plate. One way in which a contact print is made is by placing the plate having images thereon against an unexposed photoplate, drawing a vacuum between them so that they have intimate contact with one another and then exposing them to light. This produces a submaster plate which when processed will have all of the images as on the master. A submaster plate may be printed upon a chrome-coated photosensitive plate and, although this increases the cost, chrome plates may last many times longer than emulsion-coated plates for the production of working plates before being thrown away. A chrome-coated plate may be washed and reused several times.

Reprints or working plates may also be produced by a similar process of contact printing by using a photosensitive plate and a submaster plate so that a duplicate image appears. These photomasks will then be exactly the same as the master and submasters as far as the images that appear. These photomasks are then used by the integrated circuit manufacturers to produce integrated circuits. At the end of the integrated circuit manufacturing process, after the manufacturer has used the mask to make chips, he makes an electrical, optical or other type of inspection of each chip and rejects all defective ones. Location of defective chips can then be made by reference to identification numbers and the numbers forwarded to the mask manufacturer whereupon it will be determined that chips having certain common identification numbers failed to work. The photomask masters or submasters used to make that chip or the group of photomasks so used corresponding to that indexed die image is then inspected at the die image number site for possible defects in the photomask. It is found that about 80 percent of all defects in the photomasks are opacities which may be corrected by laser trimming. Defects found are removed when possible on all of the photomask tooling, the master, submaster and working plates if used and a new photomask is made using the now improved tooling and returned to the integrated circuit manufacturer for use.

These steps of determining the defective chips after the manufacturing process to ascertain the predominance of defective chips having common identification numbers, then referring to the master photomask or its appropriate submaster plate for detection of the source of the defect to determine if it exists in the photomask, followed by correction or elimination of the defect and reproduction of an improved photomask may be repeated many times, continually improving the master photomask and its related tooling such that the potential output yield obtainable by the manufacturer is greatly enhanced. By continually repeating the inspection, repair and retooling process, the photomask manufacturer aims at achieving an essentially perfect photomask or one that is as nearly as defect-free as possible. Although this will not necessarily result in an one hundred percent yield by the circuit manufacturer, it may essentially eliminate the photomask as a source of defective chips.

We claim:

1. Method of improving the yield of batch processed microcircuit semiconductor devices, comprising the steps of:

producing a master photomask for each layer of a semiconductor microcircuit, each said photomask comprising a plurality of identical dies imprinted upon a transparent plate covering said plate with said identical die images disposed in a dimensionally controlled matrix;

photographically marking each die in said matrix with unique indicia;

producing from each said master photomask a working plate, using such working plates for all required layers of the device to produce a batch of semiconductor devices, inspecting such devices, and recording the indicia of all defective devices;

inspecting the individual dies of the master photomasks indicated by such recorded indicia and repairing those dies found to be defective, then producing from said repaired master photomasks new working plates, and using such plates to produce further batches of semiconductor devices.

2. Method for improving the yield of batch processed microcircuit semiconductor devices, comprising the steps of:

photographically printing upon separate transparent plates images representing the physical layout of the layers of a microcircuit, each such image on said plate comprising a single die master reticle;

photographically reducing and reproducing each said single die master reticle on a second transparent plate a multitude of times in a dimensionally controlled matrix to form a master photomask;

photographically marking each reproduction of said die image in said matrix with different indicia;

producing from each said marked master photomasks a working plate, using the working plates thus made for each layer of the semiconductor device to produce a batch of semiconductor devices;

testing the finished devices for defects and recording the aforesaid indicia of defective devices;

inspecting those individual die images of the master photomasks indicated by said recorded indicia and repairing said die images where possible, then producing therefrom new working plates and using said working plates to produce further batches of semiconductor devices.

3. The method of claim 2 further including the steps of:

testing the further batch of devices for defects and again recording the indicia of defective devices, again inspecting those individual die images of the master photomasks indicated to be defective by said recorded indicia and repairing said die images where possible, then producing further new working plates and using the same to produce still further batches of semiconductor devices.

4. Method of improving the yield of batch processed microcircuit semiconductor devices, comprising the steps of:

from a logic or schematic circuit diagram of the desired device, first forming a composite drawing composed of the geometrical pattern of the circuit components and circuit paths of the device, said composite consisting of two or more layers superimposed upon a single sheet and being substantially larger than the actual size of the finished device;

separating the composite drawing into individual layers and photographically producing for each layer a single die master reticle;

photographically reducing the reticle image of each die image to actual size and imprinting said reduced image upon a transparent plate a plurality of times to cover said plate with multiple images of the same die image disposed in a dimensionally controlled matrix thereby providing a master photomask for each layer of said device;

photographically marking each die image in the matrix of each of said master photomasks with unique indicia, said indicia being placed within the individual die image pattern at an unused location;

producing from each of said master photomasks at least one working plate;

producing a first batch of semiconductor devices from the plurality of working plates comprising all of the die images representing the requisite layers of the device, testing such devices for defects and recording the indicia from defective devices;

inspecting the individual die images of the photomasks indicated by such recorded indicia and repairing those die images found to contain repairable defects, then producing from said repaired photomasks new working plates and using such new plates to produce further batches of semiconductor devices.

5. The method of claim 4 further including the steps of:

testing the further batch of devices for defects and again recording the indicia of defective devices, again inspecting those individual die images of the master photomasks indicated to be defective by said recorded indicia and repairing said die images where possible, then producing further new working plates and using the same to produce still further batches of semiconductor devices, and repeating said testing and repairing steps until repairable defects in the master photomasks are substantially eliminated.

* * * * *